United States Patent
Hatano et al.

(10) Patent No.: US 6,872,977 B2
(45) Date of Patent: Mar. 29, 2005

(54) THIN FILM SEMICONDUCTOR DEVICE, PRODUCTION PROCESS AND INFORMATION DISPLAYS

(75) Inventors: Mutsuko Hatano, Kokubunji (JP); Shinya Yamaguchi, Mitaka (JP); Takeo Shiba, Kodaira (JP)

(73) Assignee: Hitachi, Ltd., Tokyo (JP)

(*) Notice: Subject to any disclaimer, the term of this patent is extended or adjusted under 35 U.S.C. 154(b) by 144 days.

(21) Appl. No.: 10/188,817

(22) Filed: Jul. 5, 2002

(65) Prior Publication Data

US 2003/0104662 A1 Jun. 5, 2003

(30) Foreign Application Priority Data

Dec. 3, 2001 (JP) ........................................ 2001-368078

(51) Int. Cl.⁷ ........................ H01L 29/04; H01L 31/036
(52) U.S. Cl. ........................................................ 257/64
(58) Field of Search ............................. 257/49, 52, 57, 257/59, 64, 66, 72, 75; 438/149, 150, 166

(56) References Cited

U.S. PATENT DOCUMENTS

| | | | | |
|---|---|---|---|---|
| 5,753,544 A | * | 5/1998 | Cho et al. | 438/166 |
| 6,087,679 A | * | 7/2000 | Yamazaki et al. | 257/65 |
| 6,144,041 A | * | 11/2000 | Yamazaki et al. | 257/49 |
| 6,337,232 B1 | * | 1/2002 | Kusumoto et al. | 438/151 |
| 6,358,766 B1 | * | 3/2002 | Kasahara | 438/30 |
| 6,756,614 B2 | | 6/2004 | Hatano et al. | 257/192 |
| 2001/0015441 A1 | * | 8/2001 | Kawasaki et al. | 257/66 |

FOREIGN PATENT DOCUMENTS

| | | | | |
|---|---|---|---|---|
| JP | 2000058845 A | * | 2/2000 | ......... H01L/29/786 |
| JP | 2000-68520 | | 3/2000 | |
| WO | WO 97/45827 | | 12/1997 | |

* cited by examiner

Primary Examiner—Carl Whitehead, Jr.
Assistant Examiner—Jennifer M Dolan
(74) Attorney, Agent, or Firm—Miles & Stockbridge P.C.

(57) ABSTRACT

A thin film semiconductor device has a semiconductor thin film with a film thickness of 200 nm or less. The semiconductor thin film is formed over a dielectric substrate with a warping point of 600° C. or lower. The semiconductor thin film has a region in which a first semiconductor thin film region with the defect density of $1 \times 10^{17}$ cm$^{-3}$ or less and a second semiconductor thin film region with the defect density of $1 \times 10^{17}$ cm$^{-3}$ or more are disposed alternately in the form of stripes. The width of the first semiconductor thin film region is larger than the width of the semiconductor thin film region. The grain boundaries, grain size and orientation of crystals over the dielectric substrate are controlled, so that a high quality thin film semiconductor device is obtained.

13 Claims, 9 Drawing Sheets

THIN FILM SEMICONDUCTOR DEVICE, PRODUCTION PROCESS AND INFORMATION DISPLAYS

BACKGROUND OF THE INVENTION

The present invention relates to a process for producing a thin film semiconductor device having a semiconductor thin film. More specifically, the present invention relates to a thin film semiconductor device useful for use in such applications as image display, a production process therefor, and an information display (image display device).

Figure 10:
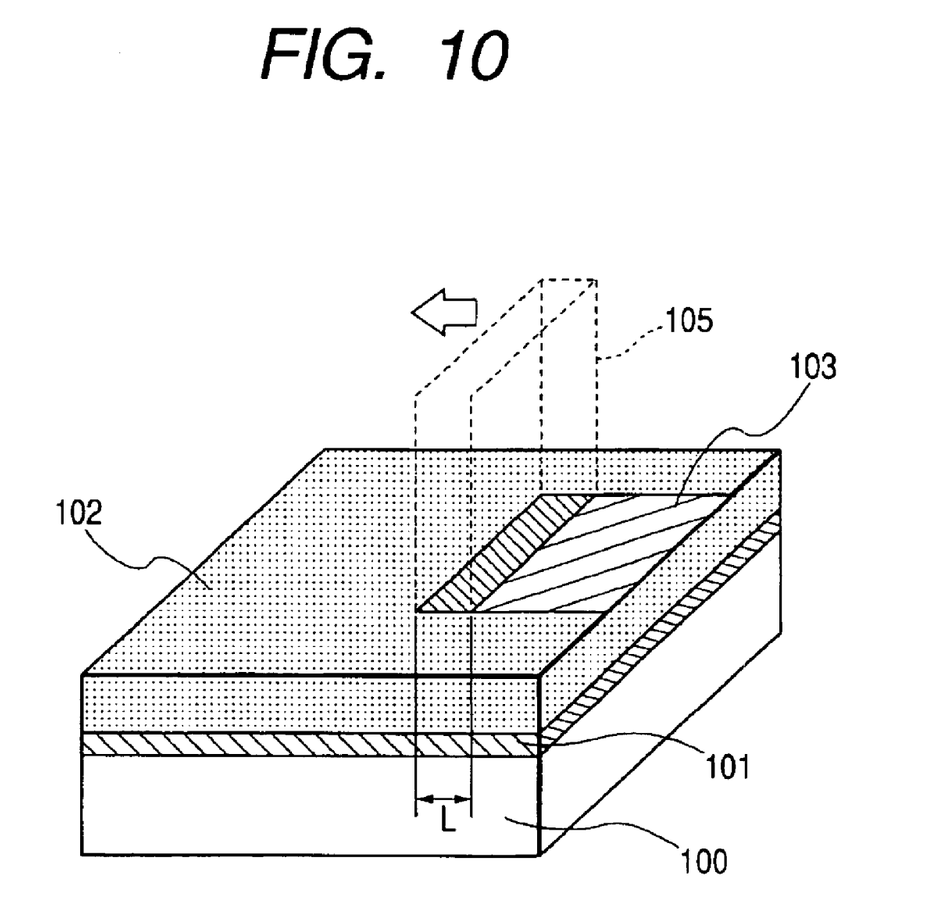
FIG. 10 is a perspective view showing an example of conventional laser beam irradiation.

The conventional method of crystallizing an amorphous silicon thin film through scanning of a pulsed laser will be described with reference to FIG. 10. FIG. 10 is a diagram showing the most common conventional crystallization method which uses an excimer pulsed laser. In this method, a laser beam 105 which is a linear excimer laser having a width L on the order of several millimeters on a substrate 100 is irradiated onto an amorphous silicon film 102 deposited over the substrate 100 through a bottom film 101. Then, the irradiating position of the laser beam 105 is shifted for every one to several pulses, thereby crystallizing the entire substrate. In this conventional method, when the laser beam is irradiated, crystal nuclei are generated in a random fashion. Further, under an ordinary laser annealing condition, an average distance between the generated crystal nuclei is 0.5 microns or less. Accordingly, the grain size of crystals in a resulting polycrystalline silicon film 103 is 0.5 microns or less, and the size of the grains is not uniform.

In WO-9745827, the following method is disclosed. The width L of the laser beam 105 illustrated in FIG. 10 is reduced to 0.5 microns or less. Then, with the position of the laser beam 105 having this shape being shifted at each interval of 0.5 microns or less, the irradiation of the pulsed laser is performed. Then, the resulting crystals grow in one orientation, starting from an initially generated crystal grain as a seed crystal. The "one orientation" herein refers to a direction perpendicular to a lateral direction or the thickness of the film formed of grown crystals.

JP-A-2000-68520 discloses the following method. In this method, as a bottom film for an amorphous silicon thin film, underlying layer films having different thermal conductivity are arranged in the form of stripes. With this arrangement, when the melting crystallization is performed by the irradiation of the excimer laser, the generating positions of crystal nuclei are controlled. A high-temperature region in contact with the underlying layer film with low thermal conductivity causes few defects in the silicon region, while a low-temperature region in contact with the underlying layer film with high thermal conductivity causes a lot of defects in the silicon region.

In the conventional methods described above, the time required for crystal growth is 100 nanoseconds or shorter. Thus, the size of the resulting crystal grains is 1 micron or less and exhibited a wide range of variation. Further, the orientations of the crystal grains are random, the density of defects is large, and the degree of surface film roughness is great. Thus, it is impossible to cause polycrystalline silicon having a large grain size to grow, or to accurately control the grain size or the positions of grain boundaries. This leads to random inclusion of the grain boundaries within a channel. Hence, it is difficult to improve device characteristics, reliability and device uniformity in a TFT array.

In the method disclosed in WO-9745827, the laser beam must be converged to a spot of several microns or less in diameter. Thus, a laser energy loss occurs, and an optical system for laser irradiation becomes complicated. Further, since the moving distance of the laser beam between pulses is several microns or less, it takes much time to crystallize the entire substrate. For this reason, achievement of a high throughput and a low cost is difficult. In particular, this method is not adaptable to a large-area substrate. Further, minute-distance travel is subject to the influence of vibration, which caused a problem in terms of yields. In the resulting semiconductor thin film, the crystal defects are induced in a direction corresponding to the scanning direction of the substrate. The orientations of the resulting grain boundaries can not be controlled, and it is difficult to improve device characteristics and uniformity in a TFT array. Further, it is impossible to make the channel free of grain boundaries.

On the other hand, in the method disclosed in JP-A-2000-68520, the positions of crystal nuclei can be partly controlled. However, it is difficult to ensure an area sufficient for disposing a thin film semiconductor device, so that improvement in device performance is impossible.

SUMMARY OF THE INVENTION

The first object of the present invention is therefore to provide a thin film semiconductor device having a high quality semiconductor thin film, in which grain boundaries, a grain size and orientation of crystals in the semiconductor film can be controlled and film roughness and crystal defects resulting from crystallization are reduced, over a substrate of a dielectric substance such as glass, and to provide an information display (image display device) to which the thin film semiconductor device is applied.

The second object of the present invention is to provide a process for producing a thin film semiconductor device having a high quality semiconductor thin film, in which it is possible to reduce the number of manufacturing steps, to be easily applied to a large-area substrate, and to achieve a high throughput and a low cost, over a substrate of a dielectric substance such as glass, and to provide an information display (image display device) to which the thin film semiconductor device is applied.

The third object of the present invention is to provide an information display (image display device) having a thin film semiconductor device which operates with high performance and a high degree of reliability on a low-cost substrate of a dielectric substance such as glass, and which has excellent device uniformity and excellent characteristics.

In order to achieve the above-mentioned objects of the present invention, there is provided the following arrangements.

In a semiconductor thin film with the film thickness of 200 nm or less formed over a dielectric substrate with a warping point of 600° C. or lower, a first semiconductor thin film region having a defect density of $1 \times 10^{17}$ cm$^{-3}$ or less and a second semiconductor thin film region having a defect density of $1 \times 10^{17}$ cm$^{-3}$ or more are alternately disposed in the form of stripes for at least one cycle, and the width of the first semiconductor thin film region is larger than the width of the second semiconductor thin film region. With this arrangement, it is possible to provide a targeted thin film semiconductor device. Concretely, a thin film transistor is disposed in the first semiconductor thin film region, and layers (e.g., power lines, ground lines and wires) other than the channel of the thin film transistor are disposed on the second semiconductor thin film region. The thin film transistor includes a gate electrode formed through a gate insulation film, source and drain regions disposed in the first semiconductor thin film region at predetermined spacing, and a channel region formed between the source and drain regions. Alternatively, at least the channel region is disposed in the first semiconductor thin film region.

A process for producing such a thin film semiconductor device according to the present invention is achieved by providing the steps of: disposing a plurality of insulation film bands at substantially given spacing on a semiconductor thin film, the insulation film bands having such a film thickness as to prevent reflection of a laser beam; setting a laser beam reflectivity R2 for regions covered with the insulation film bands and a laser beam reflectivity R1 for regions uncovered with the insulation film bands such that R1 is larger than R2; setting a width of the region covered with the insulation film band and a width of the region uncovered with the insulation film band such that the width of the region covered with the insulation film band is smaller than the width of the region uncovered with the insulation film band; and irradiating the laser beam while shifting the substrate in substantially parallel with a longitudinal direction of the insulation film bands relative to the laser beam.

Alternatively, a process for producing a thin film semiconductor device according to the present invention is achieved by providing the steps of: alternately disposing over a substrate a plurality of first insulation film bands having a width W1 and thermal conductivity K1 and a plurality of second insulation film bands having a width W2 and thermal conductivity K2, at given spacing; setting the thermal conductivity and widths of the first and second insulation film bands such that K1 is larger than K2 and that W1 is larger than W2; stacking a semiconductor thin film; and irradiating the laser beam while shifting the substrate in parallel with a longitudinal direction of the insulation film bands relative to the laser beam.

A thin film semiconductor device of a bottom-gate structure or a dual-gate structure produced in a self-alignment process is also effective in achieving the above-mentioned objects.

Other objects, features and advantages of the invention will become apparent from the following description of the embodiments of the invention taken in conjunction with the accompanying drawings.

DETAILED DESCRIPTION OF THE EMBODIMENTS

A semiconductor thin film, a thin film semiconductor device, and a production process therefor according to embodiments of the present invention are described with reference to the accompanying drawings.

Figure 1A:
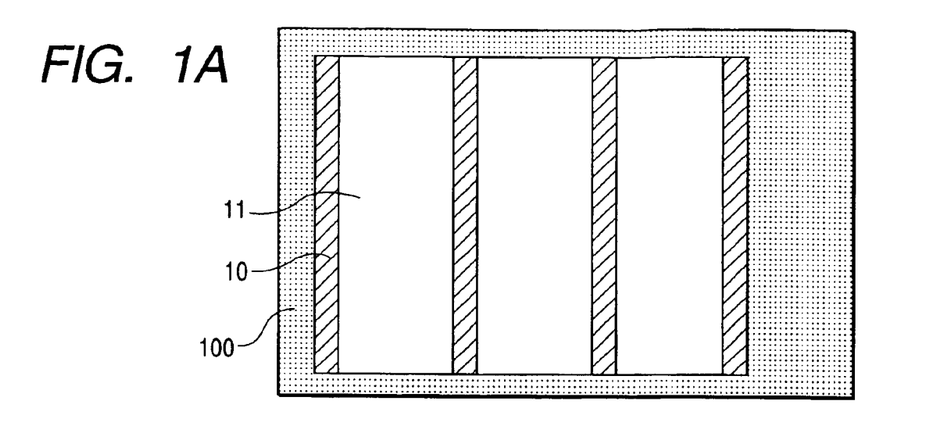
FIGS. 1A–1C are conceptual diagrams showing a thin film semiconductor device according to the present invention.
Figure 1B:
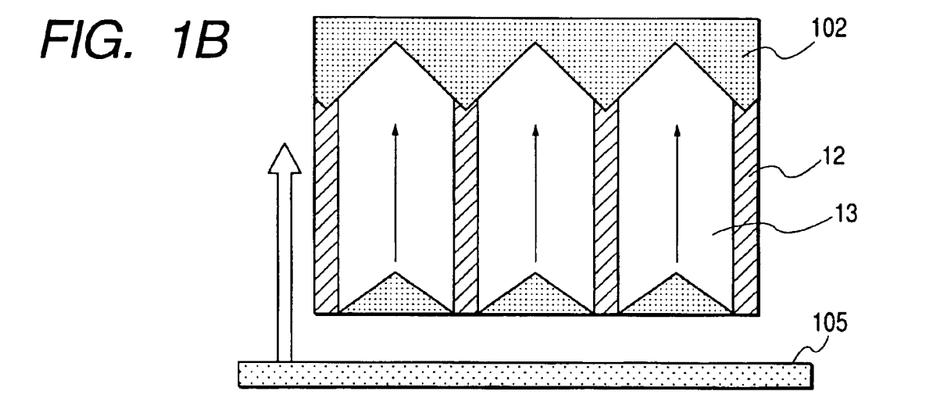
Figure 1C:
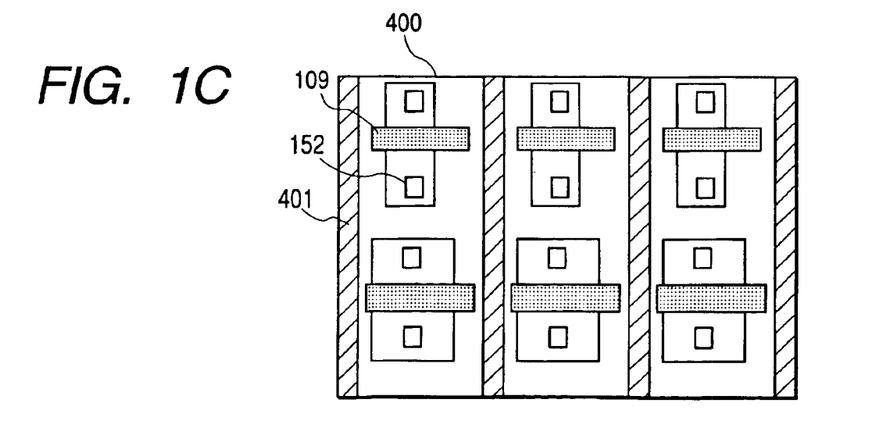

FIGS. 1A to 1C are diagrams for explaining a thin film semiconductor device. FIG. 1A is a top plan view of the semiconductor thin film. In the semiconductor thin film having the film thickness of 200 nm or less formed over a dielectric substrate 100 with a warping point of 600° C. or lower, a first semiconductor thin film region 11 having a defect density of $1 \times 10^{17}$ cm$^{-3}$ or less and a second semiconductor thin film region 10 having a defect density of $1 \times 10^{17}$ cm$^{-3}$ or more are arranged alternately in the form of stripes for at least one cycle, and the width of the first semiconductor thin film region 11 is larger than the width of the second semiconductor thin film region 10. The ratio of the defect density of the region 10 to the region 11 is larger than 2. This semiconductor thin film is obtained based on a principle shown in FIG. 1B. When irradiating a laser beam 105 onto a semiconductor thin film 102 to perform the melting crystallization, the irradiation is performed with the substrate 100 being scanned relative to the laser beam 105. During scanning, the temperature distribution is formed in the semiconductor film 102 in a direction perpendicular to the scanning direction. Referring to FIG. 1B, high-temperature regions 12 and low-temperature regions 13 correspond to the temperature distribution. With this arrangement, the time for solidifying the low-temperature regions 13 becomes shorter than the time for solidifying the high-temperature regions 12. Thus, crystallization starts from the low-temperature regions 13, and crystal growth occurs in directions shown in the arrows. During the crystal growth, grain boundaries are swept out into the high-temperature regions 12 which will be later crystallized. Accordingly, the first semiconductor thin film regions 11 having the defect density of $1 \times 10^{17}$ cm$^{-3}$ or less are formed in the low-temperature regions 13, while the second semiconductor thin film regions 10 having the defect density of $1 \times 10^{17}$ cm$^3$ or more are formed in the high-temperature regions 12. The ratio of the defect density of the region 10 to the region 11 is larger than 2. Thereby, the first and second semiconductor thin film regions 11 and 12 can be disposed alternately in the form of stripes. The length of the stripes can be adjusted according to the pulse width of the laser beam and a rate at which the substrate is scanned. In other words, by one time scanning, a high quality semiconductor region having a length in the range from 1 μm to 1 m, with less defects can be formed. Preferably, the width of the first semiconductor thin film region is 5 μm or more, being wider than the width of a gate. On the contrary, the width of the second semiconductor thin film region is preferably smaller. When the low-defect-density regions and the high-defect-density regions can be formed in the plane of the semiconductor thin film under positional control in this manner, this poses limitations to the layout of thin film transistors 400 as illustrated in FIG. 1C. If transistor channels are not disposed in the high-defect-density regions, a thin film semiconductor device with high performance can be obtained. Regions indicated by reference numeral 401 are channel formation prohibit regions. Wires between transistors, power lines and ground lines are disposed on these regions. The channels of the thin film transistors are disposed in the first semiconductor thin film regions which are the low-defect-density regions. The temperature distribution in the semiconductor thin film is obtained by forming the intensity distribution of the laser beam. Further, the temperature distribution in the semiconductor thin film is realized by the structures and the methods shown in the first to fourth embodiments to be described below.

(First Embodiment)

Figure 2A:
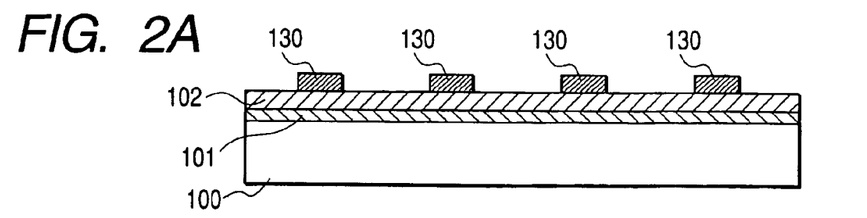
FIGS. 2A–2D are conceptual diagrams for manufacturing a thin film semiconductor device according to a first embodiment.
Figure 2B:
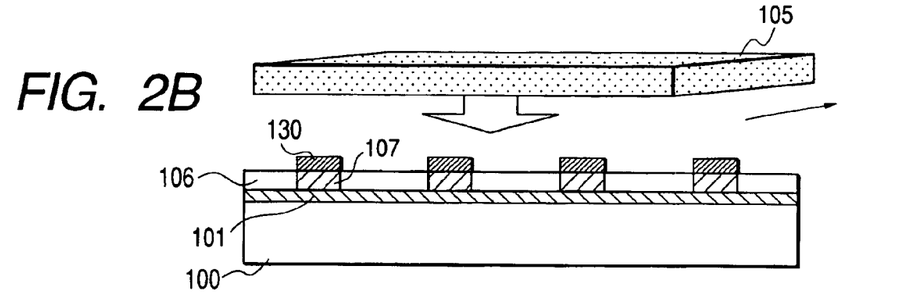
Figure 2C:
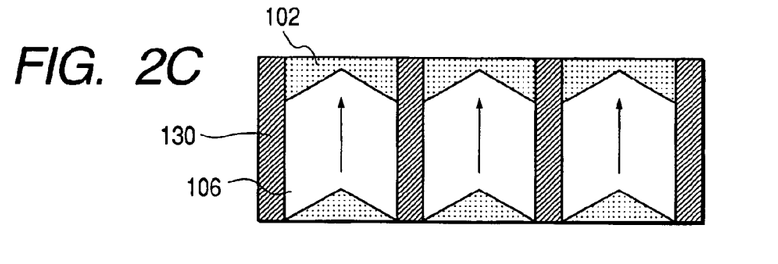
Figure 2D:
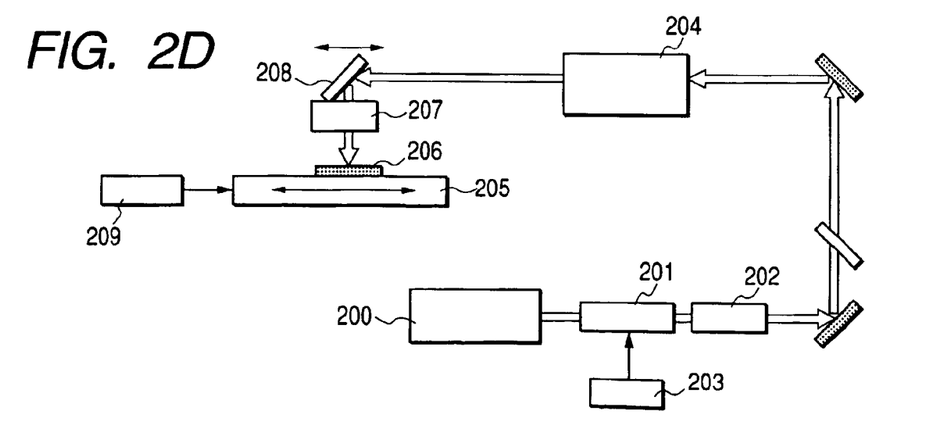

FIGS. 2A to 2D are diagrams for explaining a thin film semiconductor device according to the first embodiment of the present invention. FIGS. 2A and 2B are cross sections showing steps for explaining a production process for a semiconductor thin film according to the first embodiment of the present invention. FIG. 2C is a top plan view of the semiconductor thin film. FIG. 2D is a conceptual diagram showing an apparatus employed for the manufacture of the thin film semiconductor device according to the present invention.

As shown in FIG. 2A, a plurality of insulation film bands 130 are disposed at given spacing on an amorphous or polycrystalline semiconductor thin film 102 formed over the substrate 100 through the bottom film 101. The insulation film bands 130 have such a film thickness that they serve as antireflective films against a laser beam. Then, the laser beam reflectivity R2 of a region covered with the insulation film band 130 and the laser beam reflectivity R1 of a region uncovered with the insulation film band 130 are set such that R1 is larger than R2. Preferably, the width of the region covered with the insulation bands 130 is set to be smaller than the width of the region uncovered with the insulation bands 130. Then, with the substrate being shifted in parallel with the longitudinal direction of the antireflective film bands relative to a laser beam 105, irradiation of the laser beam 105 is performed. Preferably, the pulse width of the laser beam 105 is 1 µs or longer. The pulse width of the laser beam 105 can be arbitrarily changed during scanning of the substrate. The semiconductor regions covered with the antireflective films 130 have higher temperature than the semiconductor regions uncovered with the antireflective films 130, so that crystal growth is more induced. As shown in FIG. 2B, high-defect-density regions 107 and low-defect-density regions 106 can be thereby formed.

As shown in FIG. 2C, the semiconductor regions on which the antireflective films 130 are disposed become high-density-defect semiconductor regions, while the regions with a large reflectivity become low-density-defect semiconductor regions. By patterning films having different reflectivity for the laser beam in the form of stripes, high crystalline regions and low crystalline regions can be disposed under positional control.

FIG. 2D shows an apparatus for manufacturing a thin film semiconductor device. In this apparatus, the laser beam is irradiated onto an amorphous or polycrystalline semiconductor thin film formed over the dielectric substrate 100 to perform the melting recrystallization of the semiconductor thin film, thereby manufacturing the thin film semiconductor device. This apparatus includes a unit for modulating the pulse width, time-dependent shape and pulse interval of the laser beam, a beam shaping unit 204, a mirror 208 having a scanning function, an imaging lens system 207 for forming an image by the laser beam, and a unit for shifting a dielectric substrate 205 at a predetermined pitch in synchronization with irradiation of the laser beam. The modulating unit includes an EO modulator 201, a polarizer 202 and a driver 203. The beam shaping unit 204 shapes the profile of the laser beam emitted from an oscillation source to a proper shape by an optical system that includes a plurality of lenses or diffractive optical elements. The pulse width, time-dependent shape and pulse interval of the laser beam can be externally controlled. This control can also be performed during scanning of the substrate. By shifting the dielectric substrate 205 or the mirror 208 at predetermined speed and interval in synchronization with irradiation of the laser beam, a desired region can be crystallized. Preferably, the pulse width of the laser beam is 1 µs or longer. With this apparatus, an arbitrary-sized crystal region can be formed at any position and interval.

According to this embodiment, a high quality semiconductor thin film with reduced film roughness and crystal defects resulting from crystallization can be formed over the substrate of a dielectric substance such as glass. The grain boundaries, grain size and crystal orientation of this film can be controlled. The low-defect-density region 106 has a {110} main orientation with respect to the surface of the substrate 100, and has a {100} main orientation with respect to a surface substantially perpendicular to a direction connecting the source region 152 and the drain region 151. Low-angle grain boundaries with a rotation angle of 75 degrees or less appear between a plurality of crystal grains of which the channel region 108 is comprised. Further, the projection and depression of the surface of the channel region 12 are less than 20 nm, and the internal tensile strength of the channel region 12 is $10^9$ dyn/cm$^2$ or more, and the density of crystal defects included is less than $10^{17}$ cm$^{-3}$. The density of metal elements included in the entire semiconductor layer having the channel region 12 is $10^{19}$ cm$^{-1}$ or less. Further, in this embodiment, the number of manufacturing steps is reduced. This embodiment can be applied to a large-area substrate. A high quality semiconductor thin film thus can be formed at a high throughput and a low cost. Further, if the semiconductor thin film in this embodiment is applied to an MIS-type field effect transistor, the field effect mobility of the transistor can be controlled to approximately 300 cm$^2$/V·s or higher, and a variation in the threshold voltage of the transistor can be suppressed to ±0.2 V or lower. A thin film semiconductor device with excellent device uniformity, which operates with high performance and a high degree of reliability, thus can be obtained.

(Second Embodiment)

Figure 3A:
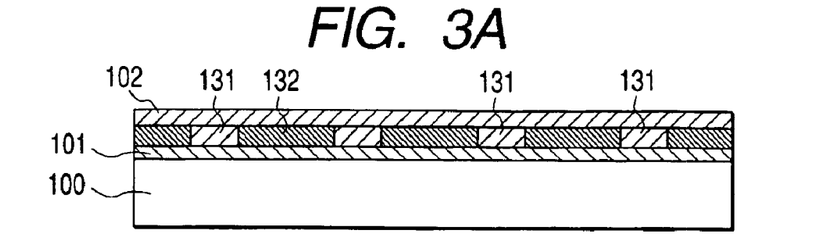
FIGS. 3A–3C are conceptual diagrams for manufacturing a thin film semiconductor device according to a second embodiment.
Figure 3B:
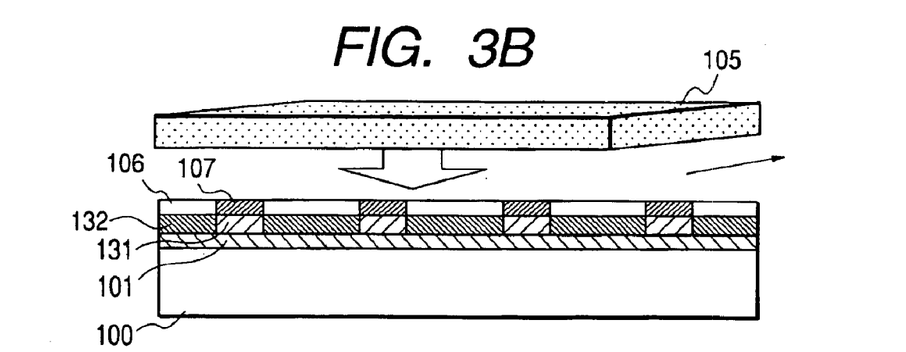
Figure 3C:
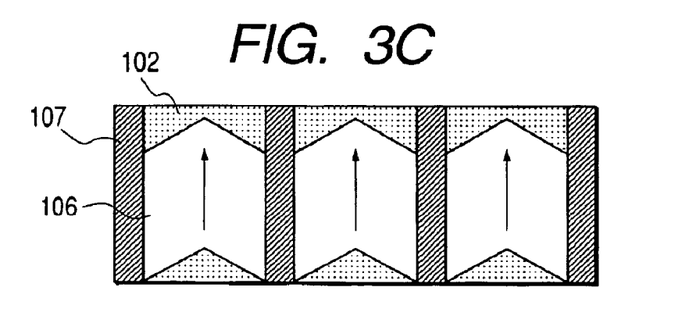

FIGS. 3A to 3C are diagrams for explaining a thin film semiconductor device according to the second embodiment of the present invention. FIGS. 3A and 3B are cross sections for explaining a production process for a thin film semiconductor film according to the second embodiment of the present invention. FIG. 3C is a top plan view of the semiconductor thin film.

As shown in FIG. 3A, a plurality of thin film bands 132 having a width W1 and thermal conductivity K1, and a plurality of thin film bands 131 having a width W2 and thermal conductivity K2 are alternately disposed at given spacing over a substrate 100. Further, the thermal conductivity K1 is set to be larger than the thermal conductivity K2, and the width W1 is set to be larger than the width W2. After formation of a semiconductor thin film 102 over these film bands, with the substrate 100 being shifted in parallel with the longitudinal direction of the thin lower film bands relative to a laser beam 105, irradiation of the laser beam 105 is performed. Preferably, the pulse width of the laser beam is 1 µs or longer. The temperature of regions in contact with the lower film bands 132 with the higher thermal conductivity becomes lower than that of regions in contact with the lower film bands 131 with the lower thermal conductivity, so that crystal growth starts from the regions in contact with the lower film bands 132. Crystal defects are swept out into the higher-temperature semiconductor regions in contact with the lower film bands 131 having the lower conductivity. As shown in FIG. 3B, high-defect-density regions 107 and low-defect-density regions 106 can be thereby formed.

As shown in FIG. 3C, the semiconductor regions in contact with the lower film bands 131 with the lower thermal conductivity become the high-density-defect semiconductor regions, while the semiconductor regions in contact with the lower film bands 132 with the large thermal conductivity become the low-defect-density semiconductor regions. By patterning films having different thermal conductivity in the form of stripes, high crystalline regions and low crystalline regions can be disposed under positional control.

According to this embodiment, a high quality semiconductor thin film with reduced film roughness and crystal defects resulting from crystallization can be formed over the substrate of a dielectric substance such as glass. The grain boundaries, grain size and crystal orientation of this film can be controlled. The low-defect-density regions 106 has a {110} main orientation with respect to the surface of the substrate 100, and has a {100} main orientation with respect to a surface substantially perpendicular to a direction connecting the source region 152 and the drain region 151. Low-angle grain boundaries with a rotation angle of 75 degrees or less appear between a plurality of crystal grains of which the channel region 108 is comprised. Further, the projection and depression of the surface of the channel region 12 are less than 20 nm, and the internal tensile strength of the channel region 12 is $10^9$ dyn/cm$^2$ or more, and the density of crystal defects included is less than $10^{17}$ cm$^3$. The density of metal elements included in the entire semiconductor layer having the channel region 12 is $10^{19}$ cm$^{-3}$ or less. Further, in this embodiment, a high quality semiconductor thin film can be formed in which it is possible to reduce the number of manufacturing steps, to be easily applied to a large-area substrate, and to achieve a high throughput and a low cost. Further, if the semiconductor thin film in this embodiment is applied to the MIS-type field effect transistor, the field effect mobility of the transistor can be controlled to approximately 300 cm$^2$/V·s or higher, and a variation in the threshold voltage of the transistor can be suppressed to ±0.2 V or lower. A thin film semiconductor device with excellent device uniformity, which operates with high performance and a high degree of reliability, thus can be obtained.

(Third Embodiment)

Figure 4:
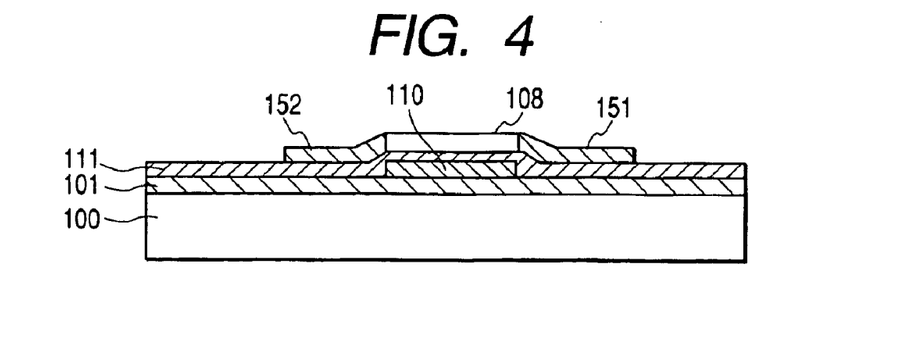
FIG. 4 is a cross section showing a thin film semiconductor device according to a third embodiment.

FIG. 4 and FIGS. 5A to 5H are diagrams for explaining a thin film semiconductor device according to the third embodiment of the present invention. FIG. 4 is a cross section showing the thin film semiconductor device according to the third embodiment, and FIGS. 5A to 5H are cross sections for explaining a production process for the thin film semiconductor device according to the present invention. The semiconductor device has a reverse-stagger structure in which a gate is formed closer to a substrate than a channel. In this semiconductor device, a bottom gate electrode 110 is disposed above a non-crystalline substrate 100 such as transparent and non-annealed glass, through a bottom layer 101 comprising of two SiN/SiO$_2$ layers. Further, the semiconductor device includes an Si semiconductor thin film in which a channel 108, a drain region 151 and a source region 152 are formed through a gate insulation film 111 comprising of SiO$_2$. As a material for the bottom gate electrode 110, a material having thermal conductivity higher than those for the bottom layer 101 and the substrate 100 is selected. More specifically, a material having thermal conductivity higher than 1 W/ms is selected. Preferably, a metal such as Al, Cr, Tn, Ti, W, or Mo, an alloy which uses one of these metals, or polysilicon with high conductivity is employed as the material. By disposing under the semiconductor thin film the bottom gate electrode 110 comprising of one of these materials, the temperature distribution is formed when laser crystallization is performed. More specifically, the temperature in the semiconductor region over the bottom gate electrode 110 becomes lower than the temperatures in other semiconductor regions. Thus, a low-density-defect crystal region is formed in a self-alignment manner. Hence, during crystallization, crystal defects are swept out into the source region 152 and the drain region 151, so that a high quality Si thin film with a few crystal defects is formed in the channel region 108.

Figure 5A:
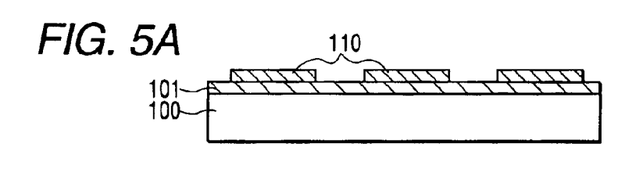
FIGS. 5A–5H are cross sections for explaining a production process for a thin film semiconductor device according to the present invention.
Figure 5B:
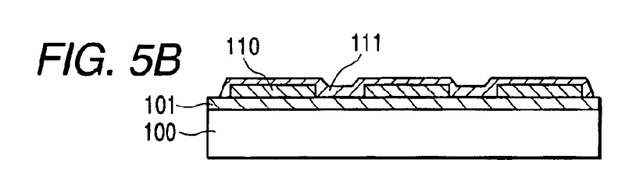
Figure 5C:
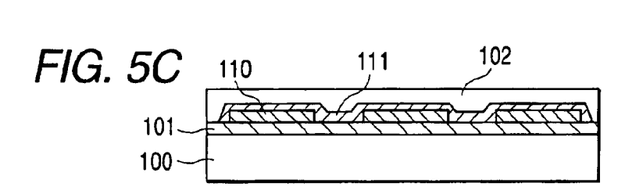
Figure 5D:
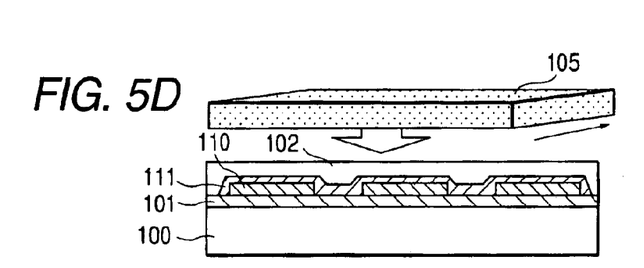
Figure 5E:
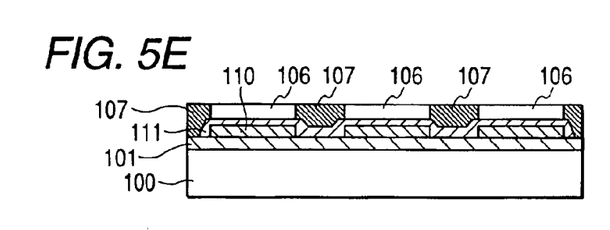
Figure 5F:
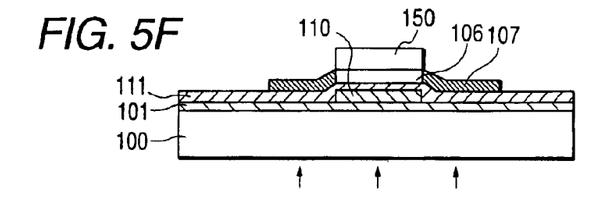
Figure 5G:
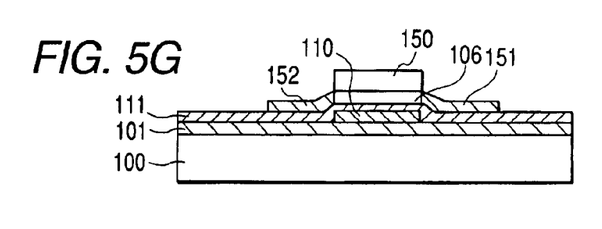
Figure 5H:
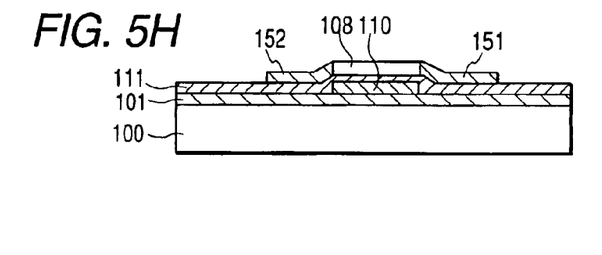

The production process will be described with reference to FIGS. 5A to 5H. As shown in FIG. 5A, an Al alloy is formed over the non-crystalline substrate 100 through the bottom layer 101, which comprises of two SiN/SiO$_2$ layers formed by plasma-enhanced chemical vapor deposition (PECVD), by sputtering to form the bottom gate electrodes 110. Next, after the gate insulation film 111 with a film thickness of 50 nm which comprises of SiO$_2$ is formed by PECVD as shown in FIG. 5B, the amorphous silicon thin film 102 with a film thickness of 100 nm is formed by PECVD as shown in FIG. 5C. The above-mentioned laser beam 105 is irradiated onto the substrate prepared in this state, as shown in FIG. 5D. Then, crystallization is performed by the apparatus illustrated in FIG. 2D. The scanning direction of the substrate 100 corresponds to the depth direction of the sheet. Preferably, the pulse width of the laser beam is 1 µs or longer. Since the thermal conductivity of the bottom gate electrodes 110 is high, the temperature of the semiconductor layer over the bottom gate electrodes 110 is lower than the temperatures in other regions. Thus, crystallization starts from the low-temperature semiconductor layer regions, and crystal defects are swept out into the high-temperature regions. The high-defect-density regions 107 and the low-defect-density regions 106 are thereby formed as shown in FIG. 5E. Next, as shown in FIG. 5F, after a positive resist is applied to the surface of the semiconductor thin film, photolithographic light is irradiated from the back of the substrate as shown in arrows. A pattern which uses the bottom gate electrode 110 as a mask is thereby transferred to form a resist 150. When impurity ion implantation is performed using the resist 150 as a mask, the source region 152 and the drain region 151 are formed in a self-alignment manner with respect to the bottom gate electrode 110 as shown FIG. 5G. By following the steps described above, the thin film semiconductor device with the reverse-stagger structure shown in FIG. 5H can be produced.

The semiconductor thin film of the channel region 108 in the thin film semiconductor device in FIG. 4 has a {110} main orientation with respect to the surface of the substrate 100, and has a {100} main orientation with respect to a surface substantially perpendicular to a direction connecting the source region 152 and the drain region 151. Low-angle grain boundaries with a rotation angle of 75 degrees or less appear between a plurality of crystal grains of which the channel region 108 is comprised. Further, the projection and depression of the surface of the channel region 108 are 20 nm or less, and the internal tensile strength of the channel region 108 is $10^9$ dyn/cm$^2$ or more, and the density of crystal defects included is $10^{17}$ cm$^{-3}$ or less. The density of metal elements included in the entire semiconductor layer having the channel region 108 is $10^{19}$ cm$^{-3}$ or less.

According to this embodiment, a low-defect-density semiconductor film can be formed in the channel region over the substrate of a dielectric substance such as glass in the self-alignment manner with respect to the gate. Further, in this embodiment, a high quality semiconductor thin film in which it is possible to reduce the number of manufacturing steps, to be easily applied to a large-area substrate, and to achieve a high throughput and a low cost can be formed. Further, the MIS-type field effect transistor in this embodiment can control its field effect mobility to approximately 300 cm$^2$/V·s or higher, and can suppress a variation in the threshold voltage of the transistor to ±0.2 V or lower. In other words, according to this embodiment, a thin film semiconductor device with excellent device uniformity which operates with high performance and a high degree of reliability can be obtained.

(Fourth Embodiment)

Figure 6:
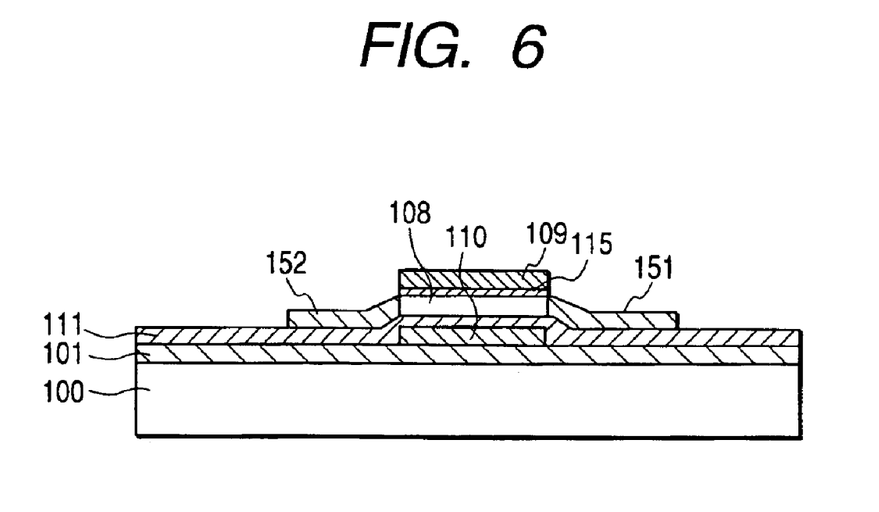
FIG. 6 is a cross section showing a thin film semiconductor device according to a fourth embodiment.

FIG. 6 and FIGS. 7A to 7H are diagrams for explaining a thin film semiconductor device according to the fourth embodiment of the present invention. FIG. 6 is a cross section showing the thin film semiconductor device according to the fourth embodiment, and FIGS. 7A to 7H are cross sections for explaining a production process of the thin film semiconductor device according to the present invention. The thin film semiconductor device is a dual-gate structure thin film semiconductor device which includes the bottom gate electrode 110 formed closer to the substrate than the channel, and a top gate electrode 109 formed over the channel. In this semiconductor device, the bottom gate electrode 110 is disposed over a non-crystalline substrate 100 such as transparent and non-annealed glass, through the bottom layer 101 comprising of two SiN/SiO$_2$ layers. Further, the Si semiconductor thin film including the channel 108, drain region 151 and source region 152 all of which are formed through a first gate insulation film 111 of SiO$_2$ is provided. Furthermore, the top gate electrode 109 is connected to the channel region 108 through a second gate insulation film 115. As a material for the bottom gate electrode 110, a material having thermal conductivity higher than those for the bottom layer 101 and the substrate 100 is selected. More specifically, a material having thermal conductivity higher than 1 W/ms is selected. Preferably, a metal such as Al, Cr, Tn, Ti, W, or Mo, an alloy which uses one of these metals, or polysilicon with high conductivity is employed as the material. By disposing under the semiconductor film the bottom gate electrode 110 comprising of one of these materials, the temperature distribution is formed when laser crystallization is performed. More specifically, the temperature in the semiconductor region over the bottom gate electrode 110 becomes lower than the temperatures in other semiconductor regions. Thus, a low-defect-density crystal region is formed in the self-alignment manner. Hence, during crystallization, crystal defects are swept out into the source region 152 and the drain region 151, so that a high quality Si thin film with a few crystal defects is formed in the channel region 108. The dual-gate structure is effective in improving the performance and reliability of transistor characteristics. In particular, the threshold voltage can be controlled by one of the gates in the dual-gate structure.

Figure 7A:
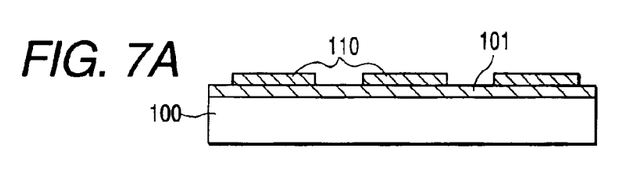
FIGS. 7A–7I are cross sections for explaining a production process for a thin film semiconductor device according to the present invention.
Figure 7B:
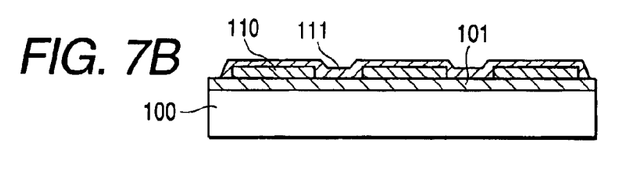
Figure 7C:
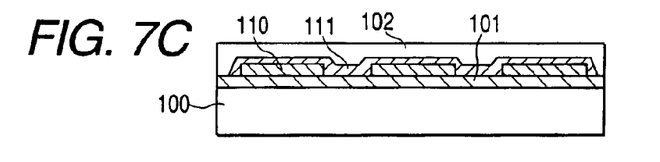
Figure 7D:
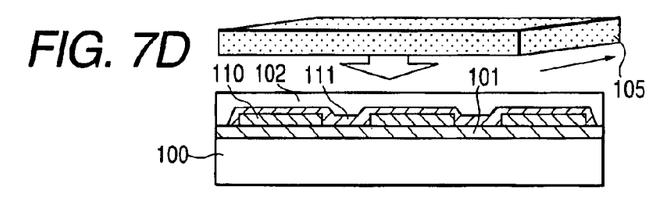
Figure 7E:
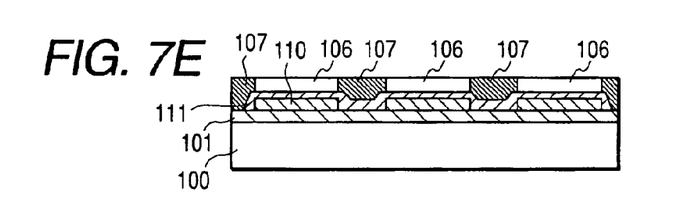
Figure 7F:
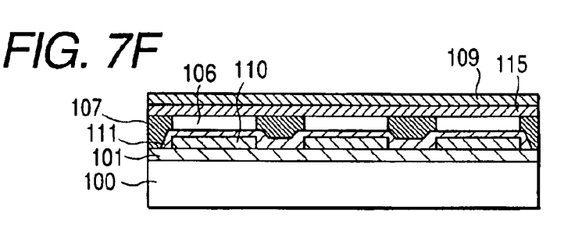
Figure 7G:
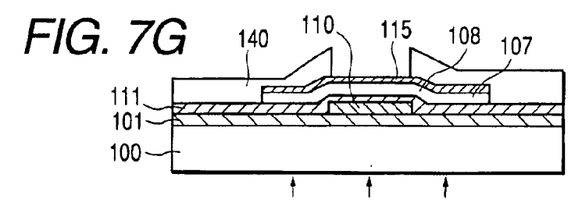
Figure 7H:
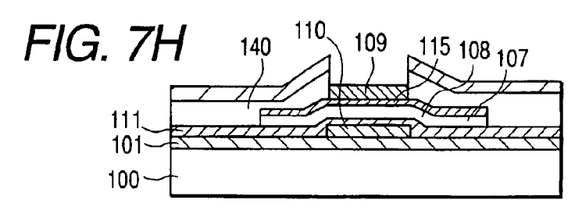
Figure 7I:
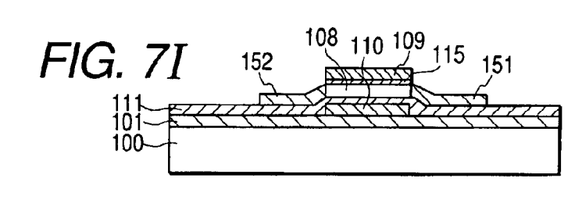

The production process will be described with reference to FIGS. 7A to 7I. By performing the steps in FIGS. 7A to 7E identical to those described with reference to FIGS. 5A to 5E in the third embodiment, the high-defect-density regions 107 and the low-defect-density regions 106 are formed in the self-alignment manner with respect to the bottom gate electrodes 110. Then, as shown in FIGS. 7F to 7H, after the second gate insulation film 115 is formed, a negative resist is applied, and then, by irradiating photolithographic light from the back of the substrate as shown in arrows, the pattern which uses the bottom gate electrode 110 as a mask is transferred to form a resist 140. Next, as shown in FIG. 7I, the film of the material for the top gate electrode 109 is formed on the resist, and then the film on the resist is removed by a lift off method. With this arrangement, the structure in which the top gate electrode 109 is formed in the self-alignment manner with respect to the bottom gate electrode 110 can be realized. Then, when impurity ion implantation is performed using the top gate electrode 109 as a mask, the source region 152 and the drain region 151 are formed in the self-alignment manner with respect to the bottom gate electrode 110, as shown in FIG. 7I. By performing the steps described above, the dual-gate thin film semiconductor device which includes both of the top and bottom gates can be produced.

The semiconductor thin film of the channel region 108 in the thin film semiconductor device in FIG. 6 has a {110} main orientation with respect to the surface of the substrate 100, and has a {100} main orientation with respect to a surface substantially perpendicular to a direction connecting the source region 152 and the drain region 151. Low-angle grain boundaries with a rotation angle of 75 degrees or less appear between a plurality of crystal grains of which the channel region 108 is comprised. Further, the projection and depression of the surface of the channel region 108 are 20 nm or less, and the internal tensile strength of the channel region 108 is 10$^9$ dyn/cm$^2$ or more, and the density of crystal defects included is 10$^{17}$ cm$^3$ or less. The density of metal elements included in the entire semiconductor layer having the channel region 108 is 10$^{19}$ cm$^{-3}$ or less.

According to this embodiment, a low-defect-density semiconductor thin film can be formed in the channel region over the substrate of a dielectric substance such as glass in the self-alignment manner with respect to the gate. Further, in this embodiment, a high quality semiconductor thin film thus can be formed in which it is possible to reduce the number of manufacturing steps, to be easily applied to a large-area substrate, and to achieve a high throughput and a low cost. Further, the MIS-type field effect transistor in this embodiment can control its field effect mobility to approximately 300 cm$^2$/V·s or higher, and can suppress a variation in the threshold voltage of the transistor to ±0.2 V or lower. In other words, according to this embodiment, a thin film semiconductor device with excellent device uniformity which operates with high performance and a high degree of reliability can be obtained.

Figure 8:
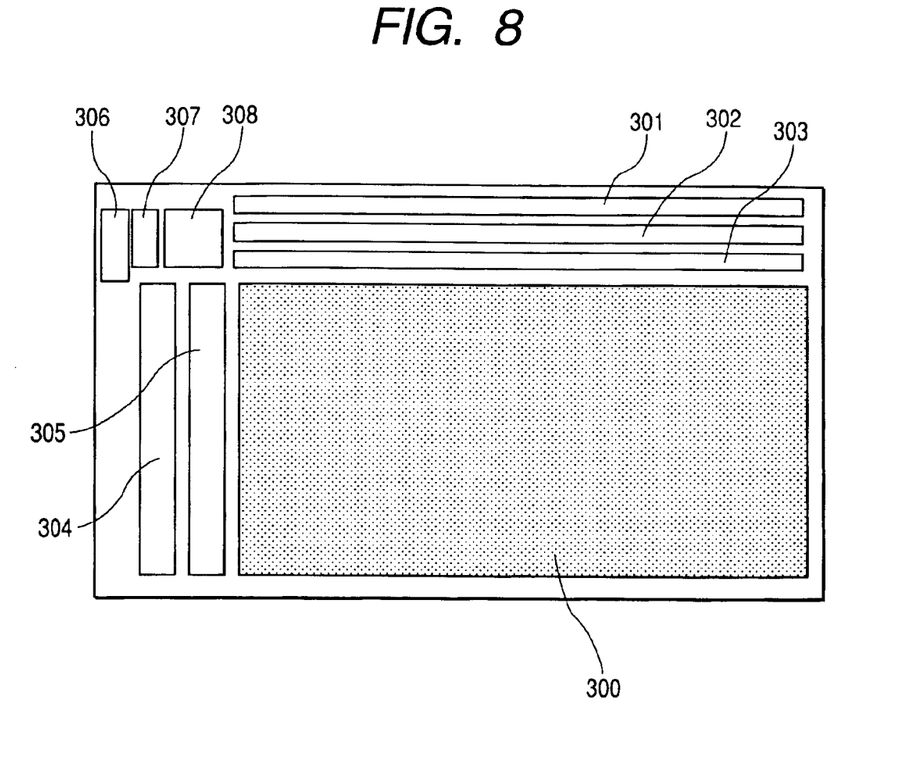
FIG. 8 is a diagram showing a configuration of an information display (image display device) according to the present invention.
Figure 9A:
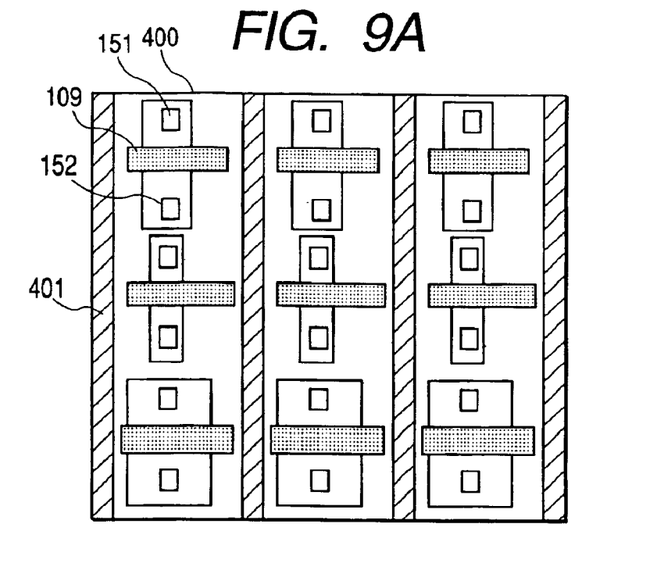
FIGS. 9A–9C are layout diagrams of a thin film semiconductor devices according to the present invention.
Figure 9B:
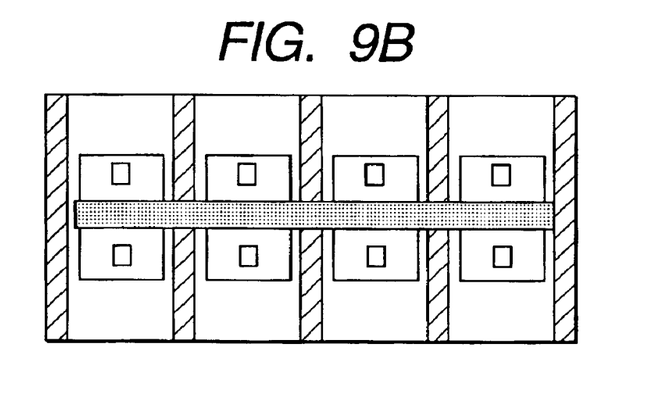
Figure 9C:
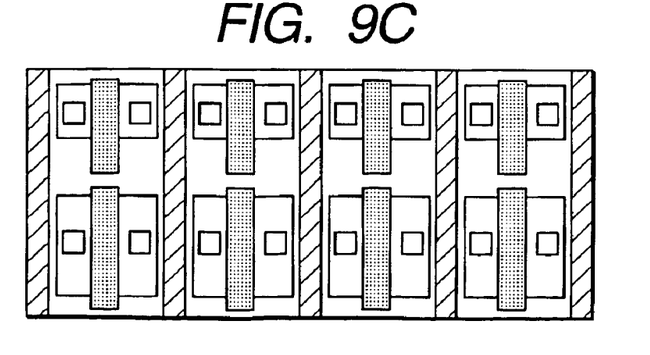

FIG. 8 is a diagram showing a configuration of an information display (image display device) according to the present invention. The information display is provided on a glass substrate, and includes a display pixel region 300. The information display further includes a decoder circuit 301, a microprocessor unit 307, a memory unit 308, a communication unit 306, a signal electrode line shift register circuit 302 serving as a signal line driver, a signal electrode line buffer circuit 303, a scanning electrode line shift register circuit 304 serving as a scanning driver, and a scanning electrode line buffer circuit 305, all of which are disposed around the display pixel region 300. Each of these components includes the thin film transistors shown in any one of the first to fourth embodiments. The semiconductor regions shown in the first to fourth embodiments are disposed in the low-defect-density semiconductor regions and the high-defect-density semiconductor regions. Thus, when a circuit is constituted, the channel regions of the thin film semiconductor device are disposed in the low-defect-density semiconductor regions, while wires are disposed on the high-defect-density semiconductor regions. The channels are disposed in regions other than the channel placement inhibit regions 401 which are the high-defect-density regions. Thus, the layout of the respective circuits illustrated in FIG. 8 features the orientation and arrangement. To take an example, since the signal electrode line buffer circuit 303 requires large current, the circuit must include the transistors with large gate widths. For this reason, in the layout of the transistors for the circuit, the channel width is divided into a plurality of channel widths in order to avoid the channel placement inhibit regions 401, as shown in FIG. 9B. With this arrangement, the channel comprises of only a high quality Si thin film, so that the high-performance and highly-reliable circuit can be constituted. In the signal electrode line shift register circuit 302 serving the signal line driver and the signal electrode line buffer circuit 303, the respective thin film transistors 400 are disposed between the channel placement inhibit regions 401, and the source-drain orientations of the transistors become parallel with the channel placement inhibit regions 401, as shown in FIG. 9A. On the other hand, in the scanning electrode line shift register circuit 304 serving as the scanning driver and the scanning electrode line buffer circuit 305, the respective thin film transistors 400 are placed between the channel placement inhibit regions 401. The source-drain orientations of the transistors become perpendicular to the channel placement inhibit regions 401.

Incidentally, the number of crystal defects in the semiconductor film described above is the value defined on the basis of their electric characteristics or a quantitative evaluation on unpaired electrons by electron spin resonance (ESR).

The semiconductor thin film which includes the low-defect-density semiconductor regions 106 and the channel regions of the thin film semiconductor devices shown in the four embodiments described above are defined as the regions which satisfy the following conditions.

(a) The Hall mobility of the single semiconductor film is in the range of 50 cm$^2$/Vs to 700 cm$^2$/Vs.

(b) The thermal conductivity of the single semiconductor film is temperature dependent, and increases to the maximum value at a given temperature. The thermal conductivity increases on a temporary basis as the temperature rises, and increases to the maximum value in the range of 50 W/mK to 100 W/mK. Under elevated temperatures, the thermal conductivity decreases with the increase in the temperature. The thermal conductivity is evaluated and defined according to the 3-omega method.

(c) The Raman shift of the single semiconductor film which is evaluated and defined on the basis of Raman scattered spectroscopy ranges from 512 cm$^{-1}$ to 518 cm$^{-1}$.

(d) The concentration of Al atoms in the semiconductor film ranges from 1×10$^{15}$ cm$^{-2}$ to 5×10$^{18}$ cm$^{-1}$. This element concentration is measured by Secondary Ion Mass Spectrometry (SIMS).

(e) The distribution of Σ values in the grain boundaries of the semiconductor film assumes the Gaussian distribution, the Σ11 being the maximum. The Σ value is measured by an electron beam diffraction method and the Electron Backscatter Diffraction Pattern (EBSP) method.

(f) The optical constants of the semiconductor film satisfy the following conditions:

Reflective index "n" at a wavelength of 500 nm is from 2.0 to 4.0, and attenuation coefficient "k" is from 0.3 to 1; and the reflective index "n" at a wavelength of 300 nm is from 3.0 to 4.0, and the attenuation coefficient "k" is from 3.5 to 4. These optical constants are measured by the spectroscopic ellipsometer.

According to the present invention, a thin film semiconductor device having a high quality semiconductor thin film, in which it is possible to control the grain boundaries, grain size and orientation of crystals and to reduce the film roughness and crystal defects resulting from crystallization, over the substrate of a dielectric substance such as glass, and an information display (image display device) to which the thin film semiconductor device is applied can be obtained.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A thin film semiconductor device, comprising:
   a semiconductor thin film, with a film thickness of 200 nm or less, formed over a dielectric substrate having a warping point of 600° C. or lower, wherein
   the semiconductor thin film includes a striped region which includes a first semiconductor thin film region and a second semiconductor thin film region which are alternately disposed in the form of stripes, the first semiconductor thin film region having a defect density of 1×10$^{17}$ cm$^{-3}$ or less and the second semiconductor thin film region having a defect density of 1×10$^{17}$ cm$^{-3}$ or more;
   the first semiconductor thin film region has a width larger than a width of the second semiconductor thin film region; and
   the first semiconductor thin film region has a film thickness smaller than a film thickness of the second semiconductor thin film region.

2. The thin film semiconductor device according to claim 1, wherein the first semiconductor thin film region has a {110} main orientation with respect to a surface of the substrate, and a {100} main orientation with respect to a surface substantially perpendicular to the substrate and the striped region.

3. The thin film semiconductor device according to claim 1, wherein
   a thin film transistor is disposed in the first semiconductor thin film region, the thin film transistor comprising a gate electrode formed through a gate insulation film, a source and drain disposed at a predetermined spacing, and a channel region formed between the source and the drain; and
   a power line, a ground line and wires other than the channel region are disposed in the second semiconductor thin film region.

4. The thin film semiconductor device according to claim 1, wherein the defect densities of the first and second semiconductor thin film regions are created by thermally sweeping crystal defects from the first semiconductor thin film region into the second semiconductor thin film region using laser beam irradiation.

5. An information display comprising a thin film semiconductor device which has a semiconductor thin film with a film thickness of 200 nm or less, wherein
   the semiconductor thin film is formed over a dielectric substrate with a warping point of 600° C. or lower;
   the semiconductor thin film includes a striped region in which a first semiconductor thin film region and a second semiconductor thin film region are disposed alternately in the form of stripes, the first semiconductor thin film region having a defect density of $1 \times 10^{17}$ cm$^{-3}$ or less, and the second semiconductor thin film region having a defect density of $1 \times 10^{17}$ cm$^{-3}$ or more;

the first semiconductor thin film region has a width larger than a width of the second semiconductor thin film region; and the first semiconductor thin film region has a film thickness smaller than a film thickness of the second semiconductor thin film region.

6. The information display according to claim 5, wherein the first semiconductor thin film region has a {110} main orientation with respect to a surface of the substrate, and a {100} main orientation with respect to a surface substantially perpendicular to the substrate and the striped region.

7. The image display device according to claim 5, wherein a thin film transistor is disposed in the first semiconductor thin film region, the thin film transistor comprising a gate electrode formed in the first semiconductor thin film region through a gate insulation film, a source and drain disposed in the first semiconductor thin film region at predetermined spacing, and a channel region formed between the source and the drain; and a power line, a ground line and wires other than the channel are disposed in the second semiconductor thin film region.

8. The display according to claim 5, wherein the defect densities of the first and second semiconductor thin film regions are created by thermally sweeping crystal defects from the first semiconductor thin film region into the second semiconductor thin film region using laser beam irradiation.

9. A thin film semiconductor device, comprising:

a dielectric substrate having a warping point of 600° C. or lower;

a first plurality of thin film bands, formed over the dielectric substrate each having a first width and a first thermal conductivity;

a second plurality of thin film bands, formed over the dielectric substrate alternatingly with the first plurality of thin film bands, each having a second width smaller than the first width and a second thermal conductivity smaller than the first thermal conductivity; and a semiconductor thin film, formed over the first and second plurality of thin film bands, having a film thickness of 200 nm or less, the semiconductor thin film including:

a first semiconductor thin film region, formed over the first plurality of thin film bands, having a defect density of $1 \times 10^{17}$ cm$^{-3}$ or less, and a second semiconductor thin film region, formed over the second plurality of thin film bands, having a defect density of $1 \times 10^{17}$ cm$^{-3}$ or more.

10. The thin film semiconductor device according to claim 9, wherein the first semiconductor thin film region has a {110} main orientation with respect to a surface of the substrate, and a {100} main orientation with respect to a surface substantially perpendicular to the surface of the substrate.

11. The thin film semiconductor device according to claim 9, wherein a film thickness of the first semiconductor thin film region is smaller than a film thickness of the second semiconductor thin film region.

12. The thin film semiconductor device according to claim 9, further comprising:

a thin film transistor, disposed in the first semiconductor thin film region, having a gate electrode formed through a gate insulation film, a source and a drain disposed at a predetermined spacing, and a channel region formed between the source and the drain; and at least one of a power line, a ground line and a connecting wire, disposed in the second semiconductor thin film region.

13. The thin film semiconductor device according to claim 9, wherein the defect densities of the first and second semiconductor thin film regions are created by thermally sweeping crystal defects from the first semiconductor thin film region into the second semiconductor thin film region using laser beam irradiation.

* * * * *